United States Patent
Doyle et al.

(10) Patent No.: US 9,754,996 B2
(45) Date of Patent: Sep. 5, 2017

(54) WRITE CURRENT REDUCTION IN SPIN TRANSFER TORQUE MEMORY DEVICES

(71) Applicant: INTEL CORPORATION, Santa Clara, CA (US)

(72) Inventors: Brian S. Doyle, Portland, OR (US); David L. Kencke, Beaverton, OR (US); Charles C. Kuo, Hillsboro, OR (US); Dmitri E. Nikonov, Morgan Hill, CA (US); Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 119 days.

(21) Appl. No.: 14/312,125

(22) Filed: Jun. 23, 2014

(65) Prior Publication Data

US 2014/0299953 A1    Oct. 9, 2014

Related U.S. Application Data

(62) Division of application No. 12/971,977, filed on Dec. 17, 2010, now Pat. No. 8,796,794.

(51) Int. Cl.
*H01L 29/82* (2006.01)
*H01L 27/22* (2006.01)
(Continued)

(52) U.S. Cl.
CPC .......... *H01L 27/228* (2013.01); *G11C 11/161* (2013.01); *H01L 43/02* (2013.01); *H01L 43/08* (2013.01)

(58) Field of Classification Search
CPC ..... G11C 11/161; H01L 27/228; H01L 43/02; H01L 43/08
See application file for complete search history.

(56) References Cited

U.S. PATENT DOCUMENTS 6,480,412 B1    11/2002   Bessho et al.
6,611,034 B2     8/2003   Den
(Continued)

FOREIGN PATENT DOCUMENTS

CN        1430292 A       7/2003
CN      101896976 A      11/2010
(Continued)

OTHER PUBLICATIONS

Notice of Allowance received for Taiwanese Patent Application No. 099136545, dated Jul. 29, 2014, 1 page of English Translation and 2 Pages of Notice of Allowance.
(Continued)

*Primary Examiner* — Meiya Li
(74) *Attorney, Agent, or Firm* — Winkle, PLLC

(57) ABSTRACT

The present disclosure relates to the fabrication of spin transfer torque memory elements for non-volatile microelectronic memory devices. The spin transfer torque memory element may include a magnetic tunneling junction connected with specifically sized and/or shaped fixed magnetic layer that can be positioned in a specific location adjacent a free magnetic layer. The shaped fixed magnetic layer may concentrate current in the free magnetic layer, which may result in a reduction in the critical current needed to switch a bit cell in the spin transfer torque memory element.

3 Claims, 10 Drawing Sheets

(51) Int. Cl.
  *H01L 43/08* (2006.01)
  *G11C 11/16* (2006.01)
  *H01L 43/02* (2006.01)

(56) References Cited

U.S. PATENT DOCUMENTS

| | | |
|---|---|---|
| 6,807,091 B2 | 10/2004 | Saito |
| 7,026,673 B2 | 4/2006 | Abraham |
| 7,095,648 B2 | 8/2006 | Ditewig et al. |
| 7,098,495 B2 | 8/2006 | Sun et al. |
| 7,106,624 B2 | 9/2006 | Huai et al. |
| 7,233,039 B2 | 6/2007 | Huai et al. |
| 7,430,135 B2 | 9/2008 | Huai et al. |
| 7,474,514 B2 | 1/2009 | Nishioka et al. |
| 7,486,547 B2 | 2/2009 | Tsuji |
| 7,572,645 B2 | 8/2009 | Sun et al. |
| 7,772,659 B2 | 8/2010 | Rodmacq et al. |
| 7,936,597 B2 | 5/2011 | Clinton et al. |
| 7,986,544 B2 | 7/2011 | Ken et al. |
| 8,053,244 B2 | 11/2011 | Ryan et al. |
| 8,063,460 B2 | 11/2011 | Nikonov et al. |
| 8,198,629 B2 | 6/2012 | Yamazaki et al. |
| 8,198,692 B2 | 6/2012 | Nikonov et al. |
| 8,203,389 B1 | 6/2012 | Zhou et al. |
| 8,450,818 B2 | 5/2013 | Nikonov et al. |
| 8,604,886 B2 | 12/2013 | Nikonov et al. |
| 8,697,454 B2 | 4/2014 | Nikonov et al. |
| 8,796,794 B2 | 8/2014 | Doyle et al. |
| 2003/0151944 A1 | 8/2003 | Saito |
| 2005/0040438 A1 | 2/2005 | Dobisz et al. |
| 2006/0227466 A1* | 10/2006 | Yagami ............ B82Y 25/00 360/324.2 |
| 2007/0076469 A1 | 4/2007 | Ashida et al. |
| 2007/0268737 A1 | 11/2007 | Hidaka |
| 2008/0019040 A1 | 1/2008 | Zhu et al. |
| 2008/0074799 A1 | 3/2008 | Ishiwata |
| 2008/0094886 A1 | 4/2008 | Ranjan et al. |
| 2008/0121945 A1 | 5/2008 | Saito |
| 2008/0150640 A1 | 6/2008 | Dimitrov et al. |
| 2008/0197431 A1 | 8/2008 | Morise et al. |
| 2008/0225583 A1 | 9/2008 | Guo et al. |
| 2009/0109739 A1 | 4/2009 | Ranjan et al. |
| 2009/0201614 A1 | 8/2009 | Kudo et al. |
| 2010/0033881 A1 | 2/2010 | Carey et al. |
| 2010/0053823 A1 | 3/2010 | Iwayama et al. |
| 2010/0090300 A1 | 4/2010 | Xi et al. |
| 2010/0142264 A1 | 6/2010 | Numata et al. |
| 2010/0200900 A1 | 8/2010 | Iwayama |
| 2010/0214835 A1 | 8/2010 | Ding et al. |
| 2010/0258887 A1 | 10/2010 | Zhu et al. |
| 2011/0121418 A1 | 5/2011 | Xi et al. |
| 2011/0292718 A1 | 12/2011 | Suzuki et al. |
| 2012/0038387 A1 | 2/2012 | Nikonov et al. |
| 2012/0153412 A1 | 6/2012 | Doyle et al. |
| 2012/0217993 A1 | 8/2012 | Nikonov et al. |
| 2012/0248556 A1 | 10/2012 | Nikonov et al. |
| 2013/0015543 A1 | 1/2013 | Gao et al. |
| 2013/0256818 A1 | 10/2013 | Nikonov et al. |
| 2013/0313623 A1 | 11/2013 | Vrudhula et al. |
| 2014/0022836 A1 | 1/2014 | Kim et al. |
| 2014/0111283 A1 | 4/2014 | Nikonov et al. |
| 2016/0079920 A1 | 3/2016 | Nikonov et al. |

FOREIGN PATENT DOCUMENTS

| | | |
|---|---|---|
| EP | 2234269 A1 | 9/2010 |
| JP | 2002-305337 A | 10/2002 |
| JP | 2004-214346 A | 7/2004 |
| JP | 2008-066479 A | 3/2008 |
| JP | 2010-206023 A | 9/2010 |
| KR | 10-2012-0021723 A | 3/2012 |
| TW | 573376 B | 1/2004 |
| WO | 2008/115291 A2 | 9/2008 |
| WO | 2010/087269 A1 | 8/2010 |
| WO | 2011/075257 A2 | 6/2011 |
| WO | 2011/075257 A3 | 9/2011 |
| WO | 2012/082403 A2 | 6/2012 |
| WO | 2012/087551 A1 | 6/2012 |
| WO | 2012/082403 A3 | 8/2012 |

OTHER PUBLICATIONS

Office Action received for Taiwan Patent Application No. 099136545, dated Feb. 21, 2014, 4 Pages of Office Action and 3 Page of English Translation.
Notice of Allowance received for Korean Patent Application No. 10-2012-7016812 , dated Jan. 28, 2014, 2 Pages of Notice of Allowance and 1 Page of English Translation.
Office Action received for Korean Patent Application No. 10-2012-7016812, dated Jul. 23, 2013, 3 Pages of English Translation only.
Office Action received for Korean Patent Application No. 10-2013-7015417, dated May 31, 2014, 5 pages of Office Action and 7 page of English Translation.
Office Action Received for Chinese Patent Application No. 201080057629.X , dated Dec. 30, 2013, 5 Pages of Office Action and 5 Pages of English Translation.
Notice of Allowance received for Japanese Patent Application No. 2012-542062, dated Oct. 22, 2013, 3 pages of English Translation and 3 pages of Notice of Allowance.
Office Action Received for Japanese Patent Application No. 2012-542062, dated Jul. 2, 2013, 2 pages of Office Action and 3 pages of English Translation.
Braganca et al., "A Three-Terminal Approach to Developing Spin-Torque Written Magnetic Random Access Memory Cells", IEEE Transactions on Nanotechnology, vol. 8, No. 2, Mar. 2009, pp. 190-195.
Hosomi et al., "A Novel Nonvolatile Memory with Spin Torque Transfer Magnetization Switching: Spin-RAM", Electron Devices Meeting, IEDM Technical Digest, IEEE International, Dec. 5, 2005, pp. 459-462. (English Abstract Only).
Kishi et al., "Lower-current and Fast switching of a Perpendicular TMR for High Speed and High density Spin-Transfer-Torque MRAM", Electron Devices Meeting, IEEE International, Dec. 15-17, 2008, 4 Pages. (English Abstract Only).
Mangin et al., "Current-induced magnetization reversal in nanopillars with perpendicular anisotropy", Magnetics Conference, INTERMAG 2006, IEEE International, vol. 5, May 8-12, 2006, 5 pages.
Matsunaga et al., "Fabrication of a Nonvolatile Full Adder Based on Logic-in-Memory Architecture Using Magnetic Tunnel Junctions", Applied Physics Express, vol. 1, Issue 9, Aug. 22, 2008, 3 pages.
Nikonov, Dmitri, "Beyond CMOS computing", Spin Torque Majority Gate, Intel, 2013, pp. 1-30.
Nikonov, Dmitri E., "Nanomagnet Circuits with Spin Torque Majority Gates", 11th IEEE International Conference on Nanotechnology, Aug. 15-18, 2011, pp. 1384-1388. (English Abstract Only).
Nikonov, Dmitri E., "Proposal of a Spin Torque Majority Gate Logic", IEEE Electron Device Letters, vol. 32, No. 8, Aug. 2011, pp. 1128-1130.
International Preliminary Report on Patentability and Written Opinion Received for PCT Patent Application No. PCT/US2010/056735, dated Jun. 28, 2012, 8 Pages.
International Search Report and Written Opinion Received for PCT Patent Application No. PCT/US2010/056735, dated Jul. 28, 2011, 9 Pages.
International Preliminary Report on Patentability and Written Opinion received for PCT Patent Application No. PCT/US2011/063072, dated Jun. 27, 2013, 7 Pages.
International Search Report and Written Opinion Received for PCT Patent Application No. PCT/US2011/063072, dated Jun. 20, 2012, 10 Pages.
International Preliminary Report on Patentability and Written Opinion received for PCT Patent Application No. PCT/US2011/063343, dated Jul. 4, 2013, 8 Pages.
International Search Report and Written Opinion Received for PCT Patent Application No. PCT/US2011/063343, dated Mar. 27, 2012, 11 Pages.

(56) References Cited

OTHER PUBLICATIONS

Slavin, Andrei, "Microwave sources: Spin-torque oscillators get in phase", Nature Nanotechnology, vol. 4, Aug. 2009, pp. 479-480.
Yoshikawa et al., "Tunnel Magnetoresistance Over 100% in MgO-Based Magnetic Tunnel Junction Films With Perpendicular Magnetic L10-FePt Electrodes", IEEE Transactions on Magnetics, Nov. 2008, pp. 2573-2576. (English Abstract Only).
Yuasa et al., "Giant room-temperature magnetoresistance in single-crystal Fe/MgO/Fe magnetic tunnel junctions", Nature Materials, vol. 3, Issue: 12, Dec. 2004, pp. 868-871. (English Abstract Only).
Office Action received for Taiwan Patent Application No. 100145965, dated Dec. 24, 2014, 7 pages of Taiwan Office Action and I page of English Search report.
Office Action received for Chinese Patent Application No. 201080057629.X, dated Aug. 4, 2014, 6 pages of English Translation and 6 pages of Chinese Office Action.
Office Action received for Taiwan Patent Application No. 100145768, dated Oct. 26, 2015, 4 pages of Taiwan Office Action and 1 page of Search Report.
Notice of Allowance received for Taiwan Patent Application No. 100145768, dated May 31, 2016, 3 Pages(1 Page of English Translation and 2 Pages of Taiwan Notice of Allowance).
Notice of Allowance received for Taiwan Patent Application No. 100145965, dated Aug. 17, 2015, 3 Pages(1 Page of English Translation and 2 Pages of Taiwan Notice of Allowance).
Office Action and Search Report Received for Taiwan Patent Application No. 103129168, dated Jan. 25, 2016, 13 Pages( 7 Pages of English Translation and 6 Pages of Taiwan Office Action).
Extended European Search Report received for European Patent Application No. 10838082.5, dated May 2, 2013, 7 pages.
Notice of Allowance received for Chinese Patent Application No. 201080057629.X, dated Nov. 18, 2014, 4 pages(2 Pages of English Translation and 2 Pages of Chinese Notice of Allowance).
Notice of Allowance received for Chinese Patent Application No. 201180060785.6, dated Apr. 5, 2016, 4 Pages(2 Pages of English Translation and 2 Pages of Chinese Notice of Allowance).

* cited by examiner

# WRITE CURRENT REDUCTION IN SPIN TRANSFER TORQUE MEMORY DEVICES

CROSS REFERENCE TO RELATED APPLICATION(S)

The present application is a division patent application of pending U.S. patent application Ser. No. 12/971,977, filed on Dec. 17, 2010 entitled "WRITE CURRENT REDUCTION IN SPIN TRANSFER TORQUE MEMORY DEVICES", the disclosure of which is incorporated by reference herein.

BACKGROUND OF THE INVENTION

The present disclosure relates generally to the fabrication of microelectronic memory. The microelectronic memory may be non-volatile, wherein the memory can retain stored information even when not powered.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1A:
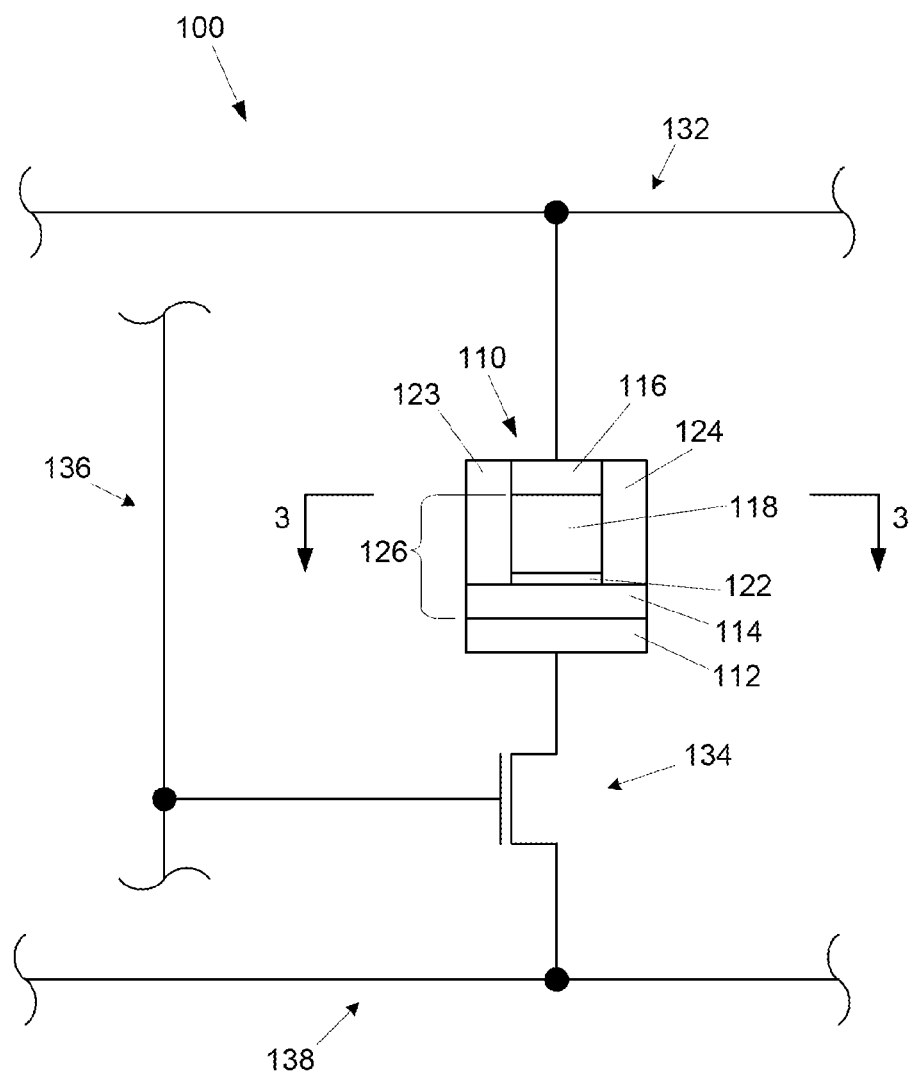
FIG. 1a is a schematic diagram illustrating a spin transfer torque memory bit cell in accordance with an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the fabrication of spin transfer torque memory element for non-volatile microelectronic memory devices. The spin transfer torque memory element may include a magnetic tunneling junction with specifically sized and/or shaped fixed magnetic layer that can be positioned in a specific location adjacent a free magnetic layer. The shaped fixed magnetic layer may concentrate current in the free magnetic layer, which may result in a reduction in the critical current needed to switch a bit cell in the spin transfer torque memory element.

FIG. 1a shows a schematic of a spin transfer torque memory bit cell 100 which includes a spin transfer torque element 110. The spin transfer torque element 110 may comprise a free magnetic layer electrode 112 with a free magnetic layer 114 adjacent the free magnetic layer electrode 112, a fixed magnetic layer electrode 116 adjacent a fixed magnetic layer 118, and a tunneling barrier layer 122 deposed between the free magnetic layer 114 and the fixed magnetic layer 118. A first dielectric element 123 and a second dielectric element 124 may be formed adjacent the fixed magnetic layer electrode 116, the fixed magnetic layer 118, and the tunneling barrier layer 122. The fixed magnetic layer electrode 116 may be electrically connected to a bit line 132. The free magnetic layer electrode 112 may be connected to a transistor 134. The transistor 134 may be connected to a word line 136 and a source line 138 in a manner that will be understood to those skilled in the art. The spin transfer torque memory bit cell 100 may further include addition read and write circuitry (not shown), a sense amplifier (not shown), a bit line reference (not shown), and the like, as will be understood by those skilled in the art, for the operation of the spin transfer torque memory bit cell 100. It is understood that a plurality of the spin transfer torque memory bit cells 100 may be operably connected to one another to form a memory array (not shown), wherein the memory array can be incorporated into a non-volatile memory device.

The portion of the spin transfer torque element 110 comprising the free magnetic layer 114, the tunneling barrier layer 122, and the fixed magnetic layer 118 is known as a magnetic tunneling junction 126. The free magnetic layer 114 and the fixed magnetic layer 118 may be ferromagnetic layers, including but not limited to cobalt/iron alloys, nickel/iron alloys, platinum/iron alloys, and the like, which are able to hold a magnetic field or polarization. The tunneling barrier layer 122, which separates the free magnetic layer 114 and the fixed magnetic layer 118, may be an oxide layer, including but not limited to magnesium oxide (MgO), aluminum oxide ($Al_2O_3$), and the like. The tunneling barrier layer 122 may have a thickness, e.g. a distance between the free magnetic layer 114 and the fixed magnetic layer 118 of about 1 nm or less, such that electrons can tunnel therethrough, if a bias voltage is applied between the free magnetic layer electrode 112 and the fixed magnetic layer electrode 116. The free magnetic layer electrode 112 and the fixed magnetic layer electrode 116 may be fabricated from any appropriate conductive material, including but not limited to, tantalum and alloys thereof, titanium and alloys thereof, and the like.

Figure 1B:
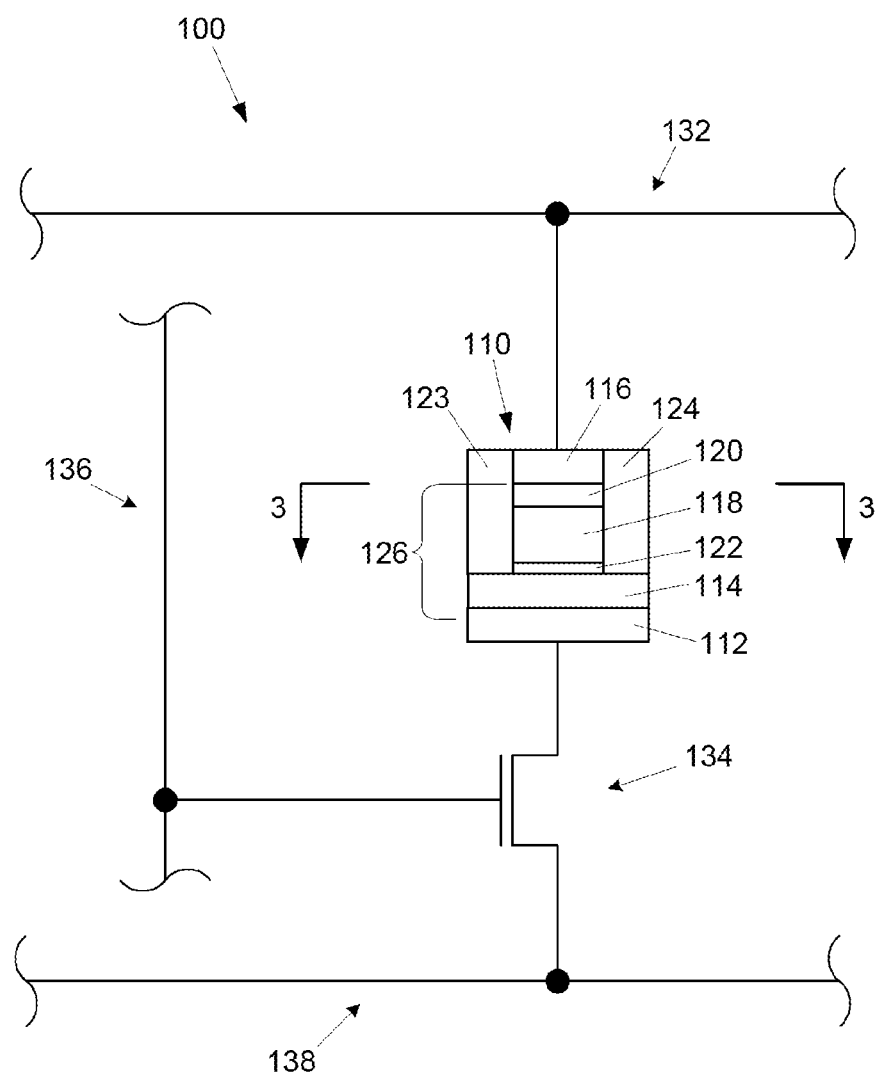
FIG. 1b is a schematic diagram illustrating a spin transfer torque memory bit cell in accordance with another embodiment of the present description.
Figure 1C:
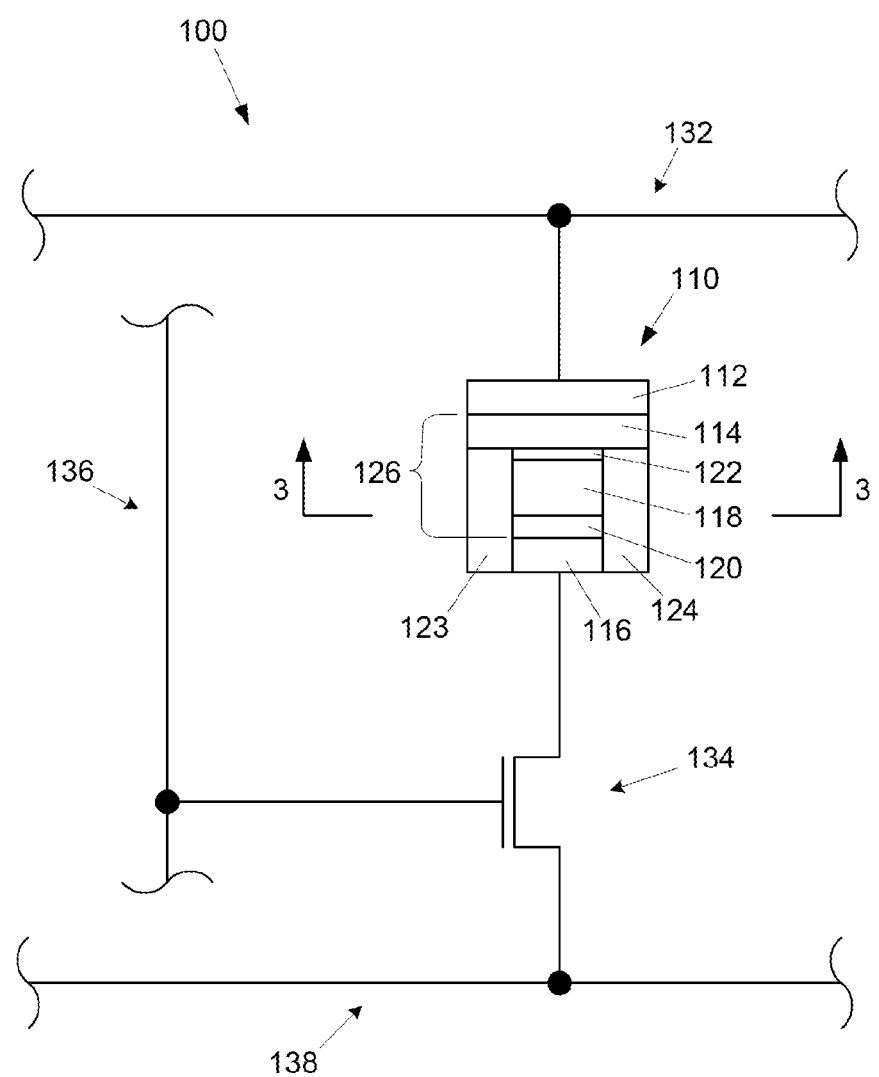
FIG. 1c is a schematic diagram illustrating a spin transfer torque memory bit cell in accordance with still another embodiment of the present description.

As illustrated in FIG. 1a, the fixed magnetic layer 118 may be "fixed" by being substantially thicker than the free magnetic layer 114 (e.g. two or more times thickness of the free magnetic layer 114. As shown in FIGS. 1b and 1c, the fixed magnetic layer 118 may be "fixed" with an antiferromagnetic layer 120, such as an indium/manganese alloy, a platinum/manganese alloy, or the like, formed adjacent the fixed magnetic layer 118.

As shown in FIG. 1c, the magnetic tunneling junction 126 may have a reverse orientation, wherein the free magnetic layer electrode 112 may be electrically connected to a bit line 132 and the fixed magnetic layer electrode 116 may be connected to a transistor 134.

Although the spin transfer torque element 110 is illustrate as a free magnetic layer electrode 112, a free magnetic layer 114, a tunneling barrier layer 122, a fixed magnetic layer 118, and a fixed magnetic layer electrode 116, it is understood the additional material layers may be present for improved performance. For example, layer of ruthenium, tantalum, copper nitride, and the like, may be disposed between the free magnetic layer electrode 112 and/or the fixed magnetic layer electrode 116, and their respective free magnetic layer 114 or fixed magnetic layer 118.

Figure 2A:
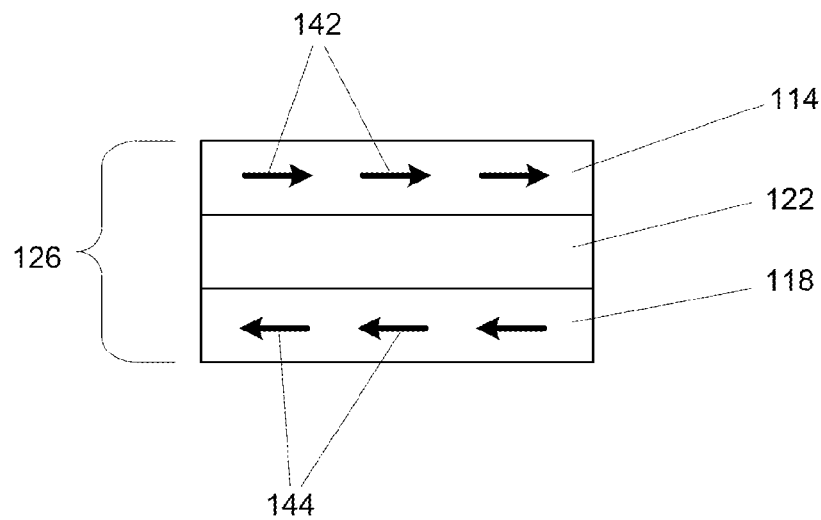
FIG. 2a is a side view schematic illustrating a magnetic tunneling junction with a free magnetic layer having a magnetic orientation anti-parallel to a fixed magnetic layer in accordance with an embodiment of the present description.
Figure 2B:
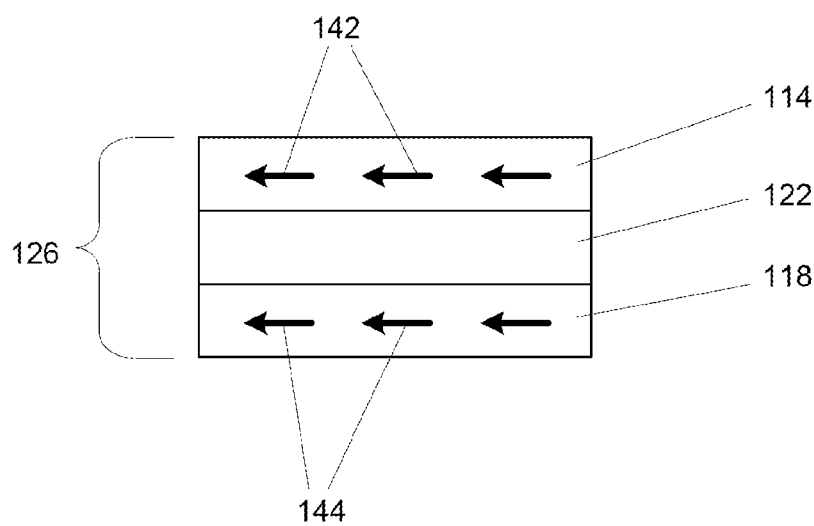
FIG. 2b is a side view schematic illustrating a magnetic tunneling junction with a free magnetic layer having a magnetic orientation parallel to a fixed magnetic layer in accordance with an embodiment of the present description.

Referring to FIGS. 2a and 2b, the magnetic tunneling junction 126 functions essentially as a resistor, where the resistance of an electrical path through the magnetic tunneling junction 126 may exist in two resistive states, either "high" or "low", depending on the direction or orientation of magnetization in the free magnetic layer 114 and in the fixed magnetic layer 118. FIG. 2a illustrates a high resistive state, wherein direction of magnetization in the free magnetic layer 114 and the fixed magnetic layer 118 are substantially opposed or anti-parallel with one another. This is illustrated with arrows 142 in the free magnetic layer 114 pointing from left to right and with arrows 144 in the fixed magnetic layer 118 aligned in opposition pointing from right to left. FIG. 2b illustrates a low resistive state, wherein direction of magnetization in the free magnetic layer 114 and the fixed magnetic layer 118 are substantially aligned or parallel with one another. This is illustrated with arrows 142 in the free magnetic layer 114 and with arrows 144 in the fixed magnetic layer 118 aligned the same direction pointing from right to left.

It is understood that the terms "low" and "high" with regard to the resistive state of the magnetic tunnel junction 126 are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the free magnetic layer 114 may be switched through a process call spin transfer torque ("STT") using a spin-polarized current. An electrical current is generally unpolarized (e.g. consisting of about 50% spin-up and about 50% spin-down electrons). A spin polarized current is one with a great number of electrons of either spin-up or spin-down, which may be generated by passing a current through the fixed magnetic layer 118. The electrons of the spin polarized current from the fixed magnetic layer 118 tunnel through the tunneling barrier layer 122 and transfers its spin angular momentum to the free magnetic layer 114, wherein to free magnetic layer 114 will orient its magnetic direction from anti-parallel, as shown in FIG. 2a, to that of the fixed magnetic layer 118 or parallel, as shown in FIG. 2b. The free magnetic layer 114 may be returned to its origin orientation, shown in FIG. 2a, by reversing the current.

Thus, the magnetic tunneling junction 126 may store a single bit of information ("0" or "1") by its state of magnetization. The information stored in the magnetic tunneling junction 126 is sensed by driving a current through the magnetic tunneling junction 126. The free magnetic layer 114 does not require power to retain its magnetic orientations; thus, the state of the magnetic tunneling junction 126 is preserved when power to the device is removed. Therefore, the spin transfer torque memory bit cell 100 of FIGS. 1a-1c is non-volatile. However, the amount of current needed to reorient the magnetization of the free magnetic layer 114 is relatively high. This relatively high current may present issues for commercial applications, as will be understood to those skilled in the art. In one embodiment, reducing the current needed to reorient the magnetization of the free magnetic layer 114 to about 1 $MA/cm^2$ or fixed magnetic layer will be necessary for a commercially acceptable spin transfer torque memory device.

In embodiments of the present description, the fixed magnetic layer may be shaped and/or positioned in a manner to concentrate current in specific location(s) in the free magnetic layer.

Figure 3A:
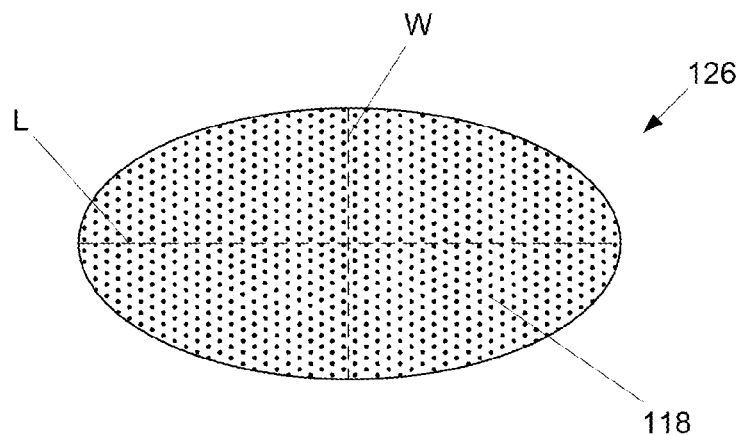
FIG. 3a illustrates a plan view along line 3-3 of any of FIGS. 1a-1c, wherein a free magnetic layer electrode substantially covers a magnetic layer as known in the art.

FIGS. 3a-3f illustrate plan views along line 3-3 of any of FIGS. 1a-1c of a magnetic tunneling junction 126 having the fixed magnetic layer 118 with a substantially oval cross section or domain shape comprising a length (axis "L") and a width (axis "W") (see FIG. 3a). The first dielectric structure 123 and the second dielectric structure 124 are not shown for the sake of clarity. In one embodiment, the fixed magnetic layer 118 of FIGS. 3a-3f has an aspect ratio (i.e., the length (axis "L" to the width (axis "W")) of about 2 to 1. In a specific embodiment the free magnetic layer 114 of FIGS. 3a-3d have a length (axis "L") of about 70 nm and a width (axis "W") of about 35 nm and a 2 ns current switching pulse. Although the free magnetic layer 114 (see FIGS. 1a-1c) is illustrated as an oval in FIGS. 3a-3f, it is understood that the free magnetic layer 114 may be any appropriate "plan view" shape.

Figure 3B:
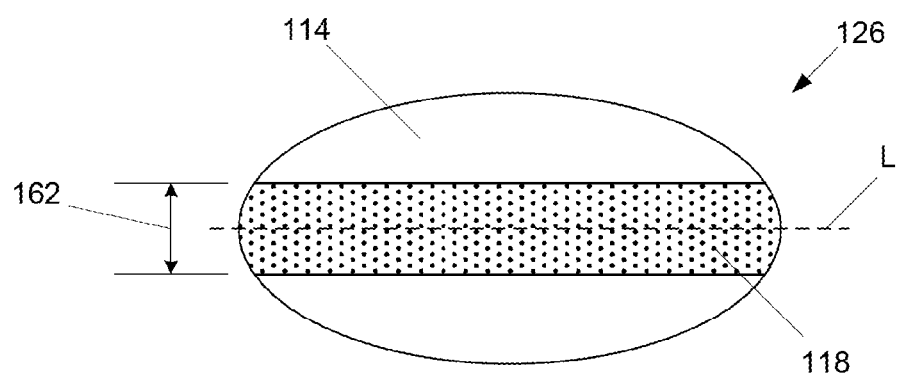
FIG. 3b illustrates a plan view along line 3-3 of any of FIGS. 1a-1c, wherein the free magnetic layer electrode comprises a stripe extending the length of the magnetic layer in accordance with an embodiment of the present description.
Figure 3C:
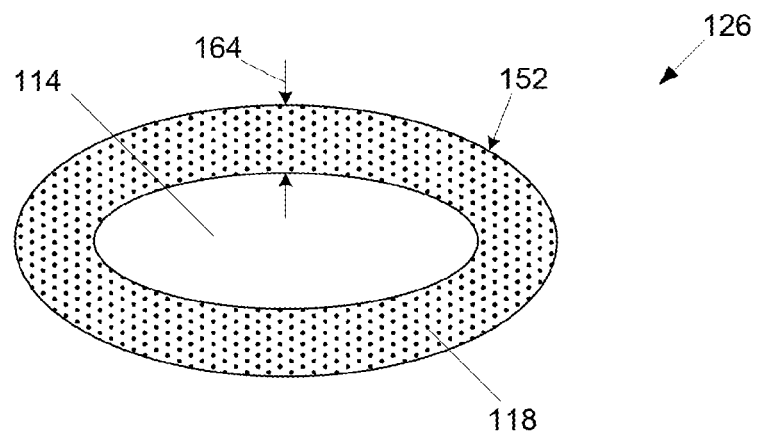
FIG. 3c illustrates a plan view along line 3-3 of any of FIGS. 1a-1c, wherein the free magnetic layer electrode comprises a ring abutting a periphery of the magnetic layer in accordance with an embodiment of the present description.
Figure 3D:
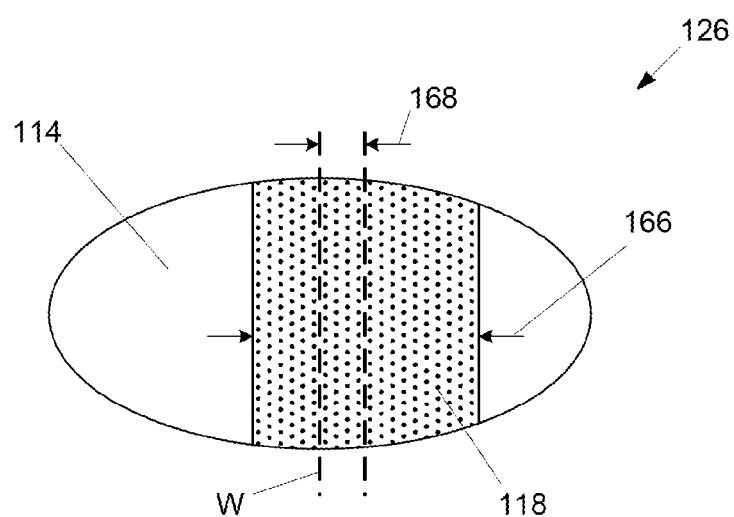
FIG. 3d illustrates a plan view along line 3-3 of any of FIGS. 1a-1c, wherein the free magnetic layer electrode comprises a stripe extending the width of the magnetic layer in accordance with an embodiment of the present description.
Figure 3E:
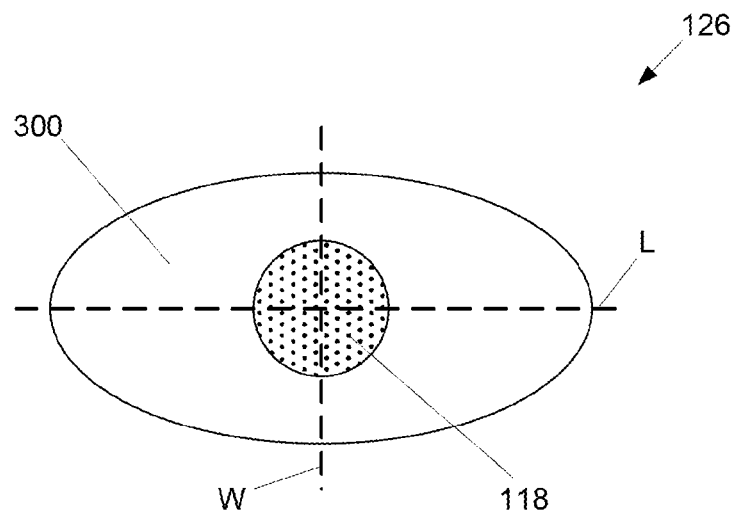
FIG. 3e illustrates a plan view along line 3-3 of any of FIGS. 1a-1c, wherein the free magnetic layer electrode comprises a circle adjacent the magnetic layer in accordance with an embodiment of the present description.
Figure 3F:
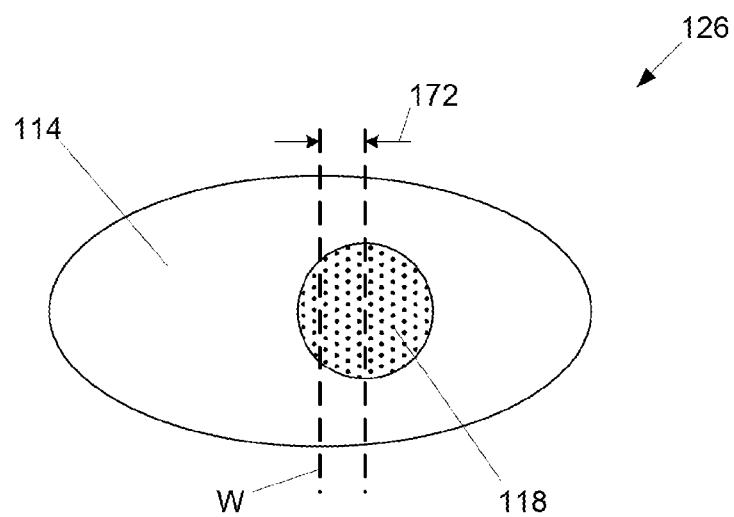
FIG. 3f illustrates a plan view along line 3-3 of any of FIGS. 1a-1c, wherein the free magnetic layer electrode comprises a circle offset a distance from a center of the magnetic layer in accordance with an embodiment of the present description.

FIG. 3a illustrates a prior art magnetic tunneling junction 126 wherein the fixed magnetic layer 118 completely covers the free magnetic layer 114 (not visible in FIG. 3a). FIG. 3b illustrates an embodiment of the present description, wherein the fixed magnetic layer 118 may be shaped in a specific pattern that is smaller than the free magnetic layer 114. As shown in FIG. 3b, the fixed magnetic layer 118 may be a "stripe" along the axis L. FIG. 3c illustrates another embodiment of the present description, wherein the fixed magnetic layer 118 is shaped as a ring extending from an edge 152 toward a center portion of the free magnetic layer 114. FIG. 3d illustrates yet another embodiment of the present description, wherein the fixed magnetic layer 118 may be a "stripe" along the axis W. FIG. 3e illustrates another embodiment of the present description, wherein the fixed magnetic layer 118 may be substantially circular approximately at a centered adjacent the free magnetic layer 114. FIG. 3f illustrates another embodiment of the present description, wherein the fixed magnetic layer 118 may be substantially circular and offset a distance 172 from the axis W. Although FIGS. 3a-3f are described in terms of the fixed magnetic layer 118 being patterned, it is understood that the fixed magnetic layer electrode 116 and/or the tunneling barrier layer 122 may also be patterned similarly.

The specific patterning and positioning of the fixed magnetic layer electrode 118 may concentrate current density to be more effective in switching the polarity of the free magnetic layer 114 and, thus, may reduce that current needed to do so and/or reduce the time needed to switch the polarity.

Figure 4:
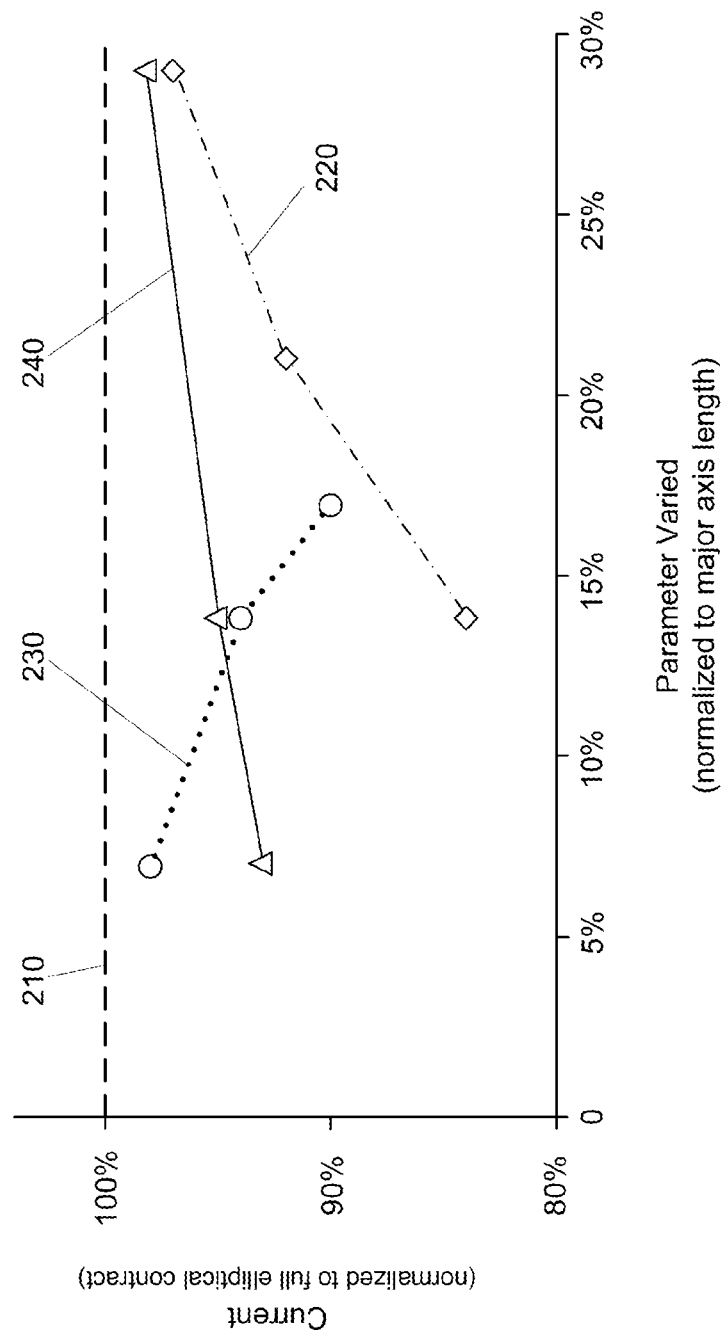
FIG. 4 is a graph of switching current versus a varied parameter in each of the embodiments of FIGS. 3b, 3c, and 3d in accordance with embodiments of the present description.

The efficiency of various shaped fixed magnetic layers 118 is illustrated in FIG. 4, wherein the y-axis is the current needed for switching the polarization ("switching current") of the free magnetic layer 114, which is normalized to the switching current needed for the structure of FIG. 3a (i.e. the free magnetic layer 114 being fully covered with the fixed magnetic layer electrode 118). The dash line 210 is the 100% current level of the structure of FIG. 3a (hereinafter the "control structure").

The line 220, demarked by diamond data points and a dash-dot line, corresponds to the free magnetic layer 114 and the fixed magnetic layer 118 of FIG. 3b. The varied parameter is the width 162 of the fixed magnetic layer 118 stripe, as shown in FIG. 3b. In FIG. 4, as the fixed magnetic layer width 162 was reduced to about 14% of length of the axis L, the switching current was reduced to about 82% of the current required by the control structure. This represented the approximate maximum reduction in switching current and any further reduction in the varied parameter width 162 resulted in an increase in the switching current and has not been graphed. In this graph, the maximum reduction occurred with a fixed magnetic layer width 162 of about 10 nm.

The line 230, demarked by circle data points and a dotted line, corresponds to the free magnetic layer 114 and the fixed magnetic layer 118 of FIG. 3c. The varied parameter is the width 164 of the fixed magnetic layer 118 ring, as shown in FIG. 3c. In FIG. 4, as the varied parameter width 164 was decreased to about 17% of length of the axis L, the switching current was reduced to about 90% of the current required by the control structure. This represented the approximate maximum reduction in switching current and any further increase in the varied parameter width 164 resulted in an increase in switching current and has not been graphed.

The line 240, demarked by triangle data points and a solid line, corresponds to the free magnetic layer 114 and the fixed magnetic layer 118 of FIG. 3d, wherein the fixed magnetic layer 118 extends along the width proximate axis W. In the illustrated embodiment, the fixed magnetic layer 118 has a width 166 of about 43% of the length of the axis L. The varied parameter is the offset 168 of the fixed magnetic layer 118 from the axis W, as shown in FIG. 3d. In FIG. 4, as the offset 168 was reduced to about 14% of the length of the axis L, the switching current was reduced to about 93% of the current required by the control structure. This represented the approximate maximum reduction in switching current and any further increase in the varied parameter offset 168 resulted in an increase in switching current and has not been graphed. Thus, the position of the fixed magnetic layer 118 may also affect the switching current for the free magnetic layer 114.

Although the present description illustrated several examples of specifically shaped fixed magnetic layer 118 adjacent either the free magnetic layer 114, the subject matter of the present description is not limited to those shapes. It is understood that the fixed magnetic layer 118 may be any shape smaller than the free magnetic layer 114 and/or in a position which may be most effective in reducing the switching current and/or in reducing the switching time of the magnetic tunneling junction 126 by concentrating current in the free magnetic layer 114.

Although the method of fabricating the spin transfer torque memory bit cell 100 has not been described herein, it is understood that the steps for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 5:
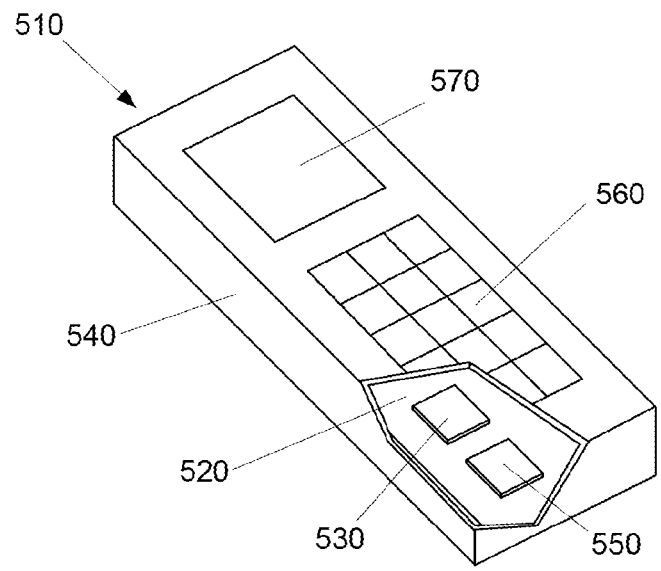
FIG. 5 illustrates an embodiment of a portable electronic device in accordance with an embodiment of the present description.

FIG. 5 illustrates an embodiment of a portable device 510, such as a cellular telephone or a personal data assistant (PDA), digital media player, of the like. The portable device 510 may comprise a substrate 520 within a housing 530. The substrate 520 may have various electronic components electrically coupled thereto including a microprocessor 540, such as a central processing units (CPUs), chipsets, graphics processor, ASICs, or other command/data processing device, and including at least one memory device 550, including but not limited to, a memory array, a BIOS chip, a solid state drive, and the like. Either the memory device 550 and/or the microprocessor 540 may have a spin transfer torque element as described in the present description. The substrate 520 may be attached to various peripheral devices including an input device, such as keypad 560, and a display device, such an LCD display 570.

Figure 6:
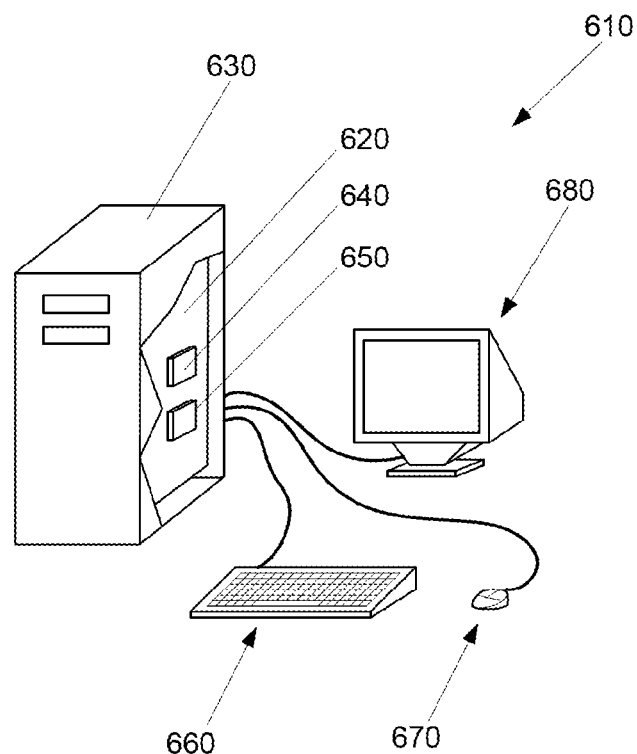
FIG. 6 illustrates an embodiment of a computer system in accordance with an embodiment of the present description.

FIG. 6 illustrates an embodiment of a computer system 610. The computer system 610 may comprise a substrate or motherboard 620 within a housing 630. The motherboard 620 may have various electronic component electrically coupled thereto including a microprocessor 640, such as a central processing units (CPUs), chipsets, graphics processor, ASICs, or other command/data processing device, and at least one memory device 650, including but not limited to, a memory array, a BIOS chip, a solid state drive, and the like. Either the memory device 650 and/or the microprocessor 640 may have a spin transfer torque element, as described in the present description. The substrate or motherboard 620 may be attached to various peripheral devices including inputs devices, such as a keyboard 660 and/or a mouse 670, and a display device, such as a monitor 680.

Figure 7:
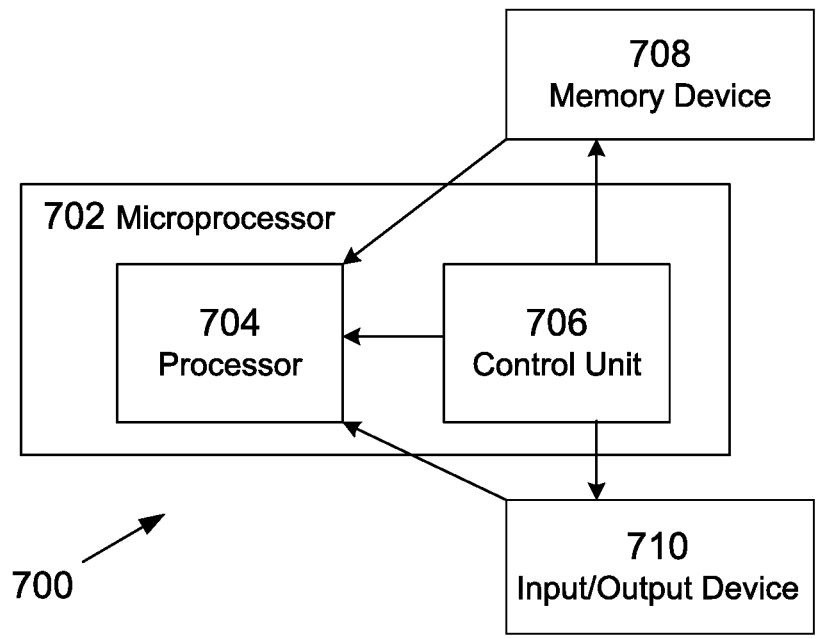
FIG. 7 is a block diagram of an electronic system in accordance with an embodiment of the present description.

FIG. 7 illustrates a block diagram of an electronic system 700. The electronic system 700 can correspond to, for example, the portable system 510 of FIG. 5, the computer system 610 of FIG. 6, a process control system, or any other system that utilizes a processor and an associated memory. The electronic system 700 may have a microprocessor 702 (having a processor 704 and control unit 706), a memory device 708, and an input/output device 710 (it is, of course, understood that the electronic system 700 can have a plurality of processors, control units, memory device units and/or input/output devices in various embodiments). In one embodiment, the electronic system 700 may have a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a spin transfer torque element as described in the present description.

Figure 8:
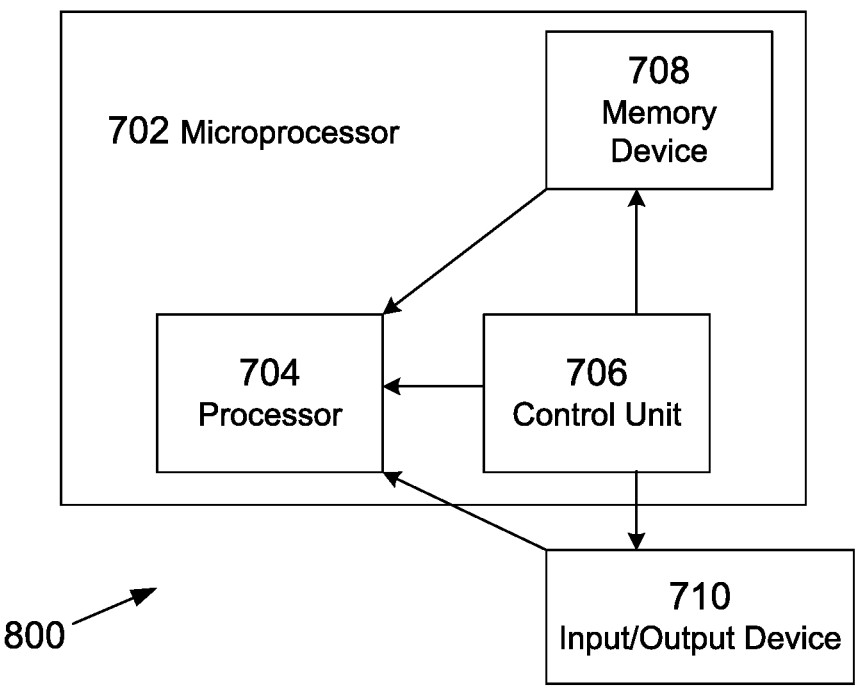
FIG. 8 is a block diagram of another electronic system in accordance with an embodiment of the present description.

FIG. 8 illustrates a block diagram of an electronic system 800 which is similar to the electronic system 700 of FIG. 7, with the exception that the memory device 708 is embedded in the process 704. All of the operations of the electronic system 800 of FIG. 8 are similar to that of the operations of the electronic system 700 of FIG. 7.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A non-volatile memory device, comprising:
   a fixed magnetic layer electrode;
   a fixed magnetic layer adjacent the fixed magnetic layer electrode;
   a free magnetic layer electrode adjacent a free magnetic layer and electrically connected to a bit line, wherein the fixed magnetic layer and the fixed magnetic layer electrode have a maximum surface area smaller than a maximum surface area of the free magnetic layer, wherein the free magnetic layer is substantially oval and has a length and a width, and wherein the fixed magnetic layer and the fixed magnetic layer electrode extends as a stripe adjacent the fixed magnetic layer along the entire free magnetic layer length;
a tunneling barrier layer disposed between the fixed magnetic layer and the free magnetic layer; and
a transistor electrically connected to the fixed magnetic layer electrode, a source line, and a word line.

2. The non-volatile memory device of claim 1, wherein the fixed magnetic layer is shaped to concentrate current within the free magnetic layer.

3. The non-volatile memory device of claim 1, wherein the fixed magnetic layer is positioned to concentrate current within the free magnetic layer.

* * * * *